United States Patent [19]

Yamada et al.

[11] 4,390,847

[45] Jun. 28, 1983

[54] MUTING DEVICE

[75] Inventors: Hisashi Yamada, Yokohama; Tsutomu Sugawara, Yokosuka, both of Japan

[73] Assignee: Tokyo Shibaura Denki Kabushiki Kaisha, Kawasaki, Japan

[21] Appl. No.: 203,497

[22] Filed: Nov. 3, 1980

[30] Foreign Application Priority Data

Nov. 20, 1979 [JP] Japan .................. 54/149529

[51] Int. Cl.$^3$ ............................ H03G 3/34
[52] U.S. Cl. ......................... 330/51; 330/281; 330/284
[58] Field of Search ............ 330/51, 279, 281, 284; 455/174, 194

[56] References Cited

U.S. PATENT DOCUMENTS 4,095,191  6/1978  Shibuya ..................... 455/194 X

*Primary Examiner*—James B. Mullins
*Attorney, Agent, or Firm*—Oblon, Fisher, Spivak, McClelland & Maier

[57] ABSTRACT

With a muting device according to this invention, an input signal is supplied to a changeover switch, which in turn is connected to an output terminal through an amplifier and muting switching circuit. A terminal from which a switching operation changeover signal is sent forth is connected to a changeover switch, and also to a muting control circuit through a differentiation circuit. The output terminal of the muting control circuit is connected to a muting switching circuit. The differentiation circuit is formed of a series circuit of a resistor and a capacitor. A junction between the differentiation circuit and muting control circuit is connected to a constant input terminal through a resistor. The muting control circuit is provided with a single input terminal.

12 Claims, 6 Drawing Figures

MUTING DEVICE

BACKGROUND OF THE INVENTION

1. Field of the Invention:

This invention relates to a muting device used with, for example, an audio amplifier.

2. Description of the Prior Art:

For an audio amplifier, it is generally demanded to suppress the occurrence of abnormal signals at the output terminal of the amplifier resulting from transient phenomena appearing when the operation of a switch is changed over, and extinguish noises from a loudspeaker connected to the amplifier. To meet the above-mentioned requirements, most audio amplifiers are provided with a muting device. Where the prior art muting device is used with an amplifier having many switching circuits, it is necessary to provide a separate circuit for differentiating a switch signal sent forth from any of a plurality of switching circuits thereby to detect a point of time at which the operation of the switch of a given switching circuit is changed over. In this case, the conventional process comprises detecting the waveform of a differentiated output signal, inverting the negative polarity of a signal included in the output signal into the positive polarity, and comparing the voltage of the differentiated output signal with a predetermined reference voltage.

Where the differentiated output signal is found to have a higher voltage than the reference voltage, then a control signal is supplied to actuate the muting device. Therefore, a muting control circuit has to be provided to send forth a control signal, thereby complicating the circuit arrangement of the muting device. Particularly where the whole muting device has to be set in a single IC element, then the circuit of the muting device is desired to have as few external terminals as possible. Therefore, the conventional muting device is not adapted to meet the above-mentioned requirement.

SUMMARY OF THE INVENTION

It is accordingly the object of this invention to provide a muting device of simple circuit arrangement which can control muting by a single external terminal even when used with an amplifier having a large number of switching circuits.

To attain the above-mentioned object, this invention provides a muting device which comprises a differentiation circuit for differentiating signals supplied to switches, and a control circuit for sending forth a muting control signal when a differentiated signal delivered from the differentiation circuit has a voltage level falling outside of the range of a predetermined voltage level. According to the invention, the control circuit can handle a plurality of switching circuits.

DETAILED DESCRIPTION OF THE PREFERRED EMBODIMENTS

Figure 1:
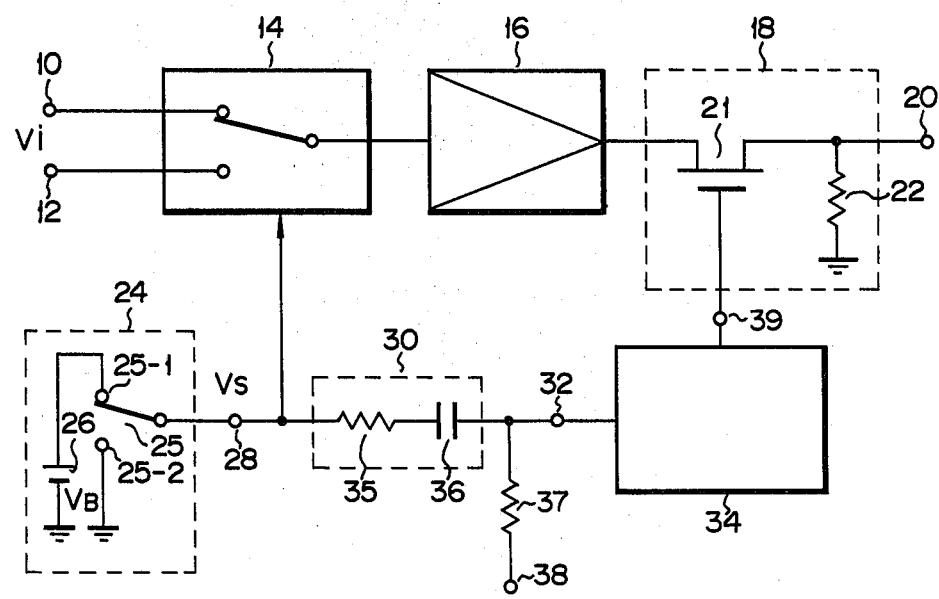
FIG. 1 is a schematic block circuit diagram of a muting device according to one embodiment of the invention.

With a muting device according to one embodiment of this invention shown in FIG. 1, the output terminals 10, 12 of the muting device are respectively connected to the corresponding input terminals of a changeover switch 14, whose output terminal is connected to a muting switching circuit 18 through an amplifier 16. The changeover switch 14 is of the same type as that which is used with, for example, a tape recorder to change its operation from the recording to the playback mode or vice versa. Input signals $v_i$ supplied to the input terminals 10, 12 are selectively conducted to the amplifier 16 by the changeover switch 14. The input signal $v_i$ is later transmitted to an output terminal 20 of the muting device. The muting switching circuit 18 is formed of, for example, one field effect transistor (abbreviated as "FET") 21 and one resistor 22. The source of the FET 21 is connected to the output end of the amplifier 16, and the drain of the FET 21 is connected to the output terminal 20 of the muting device. The resistor 22 is connected between the drain of the FET 21 and the ground. A signal-generating circuit 24 is formed of, for example, a double-throw switch 25 and reference power source 26. One contact 25-1 of the double-throw switch 25 is connected to the positive pole of the reference power source 26, whose negative pole is grounded. The other contact 25-2 of the double-throw switch 25 is grounded. A switch signal $v_s$ generated when the double-throw switch 25 is opened or closed is transmitted to the changeover switch 14 through an output terminal 28 of the double-throw switch 25, and also to a muting control circuit 34 through a differentiation circuit 30 and muting signal input terminal 32. The differentiation circuit 30 is formed of a series circuit of a resistor 35 and capacitor 36. A junction between the differentiation circuit 30 and muting control circuit 34 is connected to a constant muting input terminal 38 through a resistor 37. An output terminal 39 of the muting control circuit 34 is connected to the gate of the FET 21 which is included in the muting switching circuit 18.

Figure 2:
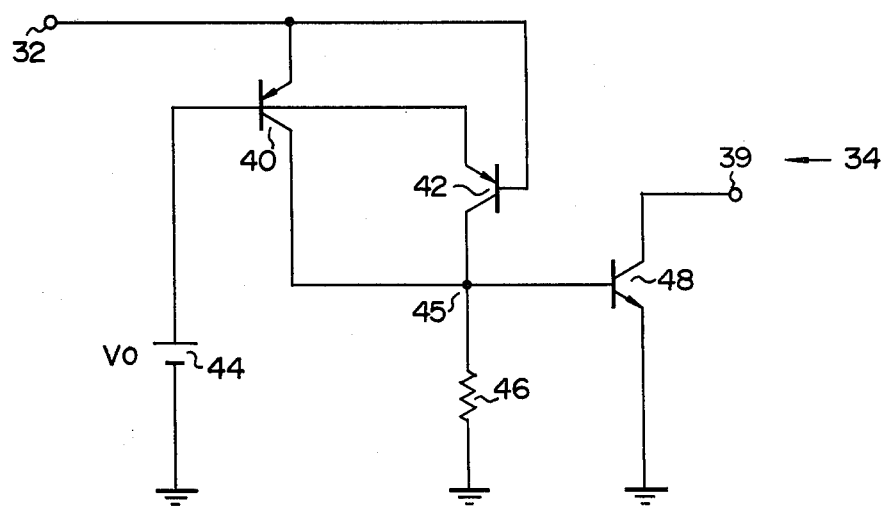
FIG. 2 schematically shows the arrangement of a muting control circuit used with the muting device according to the embodiment of FIG. 1.

With the muting control circuit 34, the muting signal input terminal 32 is connected, as shown in FIG. 2, to the emitter of a first waveform-detecting transistor 40 and also to the base of a second waveform-detecting transistor 42. The base of the first transistor 40 and the emitter of the second transistor 42 are impressed with a constant voltage $V_0$ from a bias power source 44. The collectors of the first and second transistors 40, 42 are connected together. A junction 45 between the collectors is grounded through a resistor 46, and also connected to the base of a third output transistor 48, whose emitter is grounded, and whose collector is connected to an output terminal 39 of the muting control circuit.

Figure 3A:
FIGS. 3A to 3C are timing charts illustrating the operation of a muting control circuit used with the muting device according to the embodiment of FIG. 1.
Figure 3B:
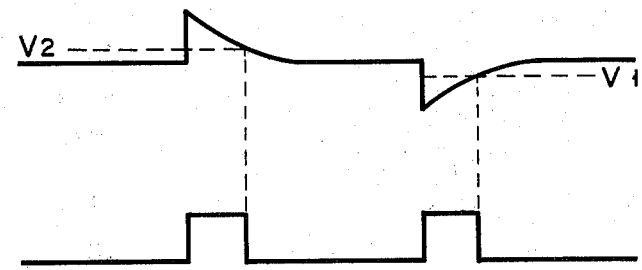
Figure 3C:

Where, with a muting device according to one embodiment of this invention arranged as described above, a signal (shown in, for example, FIG. 3A) emitted from the signal-generating circuit 24 is conducted to the terminal 28, then the signal of FIG. 3A is differentiated by the differentiation circuit 30 to be converted into a signal having a waveform illustrated in FIG. 3B. Where the signal of FIG. 3B is supplied to the muting signal input terminal 32 of the muting control circuit 34, then the muting control circuit 34 sends forth control pulses shown in FIG. 3C, if an input voltage having a differentiated waveform has a level lower than a predetermined lower voltage $V_1$ or higher than a predetermined higher voltage $V_2$ (assuming $V_2 > V_1$). In other words, where the base-emitter voltage of the first transistor 40 of the muting control circuit 34, and the base-emitter voltage of the second transistor 42 of the muting control circuit 34 stand at 0.5 volt alike, and the input terminal 32 of the muting control circuit is impressed with a voltage lower than $V_1 = V_0 - 0.5$, then the second transistor 42 is rendered conducting, causing a muting control signal of FIG. 3C to be produced at the output terminal 39 of the muting control circuit 34. Where the input terminal 32 is impressed with a high voltage than $V_2 = V_0 + 0.5$, then the first transistor 40 is rendered conducting, similarly causing a muting control signal of FIG. 3C to be generated at the output terminal 39 of the muting control circuit 34. Upon receipt of the muting control signal, the muting switching circuit 18 is rendered conducting, thereby preventing transient abnormal signals produced at the changeover of the switching operation from being transmitted to the output terminal 20 of the muting switching circuit 18. It is preferred that the voltage $V_2$ be set at a level 0.1 to 1 volt higher than the voltage $V_1$ in order to enable the above-mentioned muting operation to be carried out reliably.

With the muting device according to the first embodiment of this invention, a junction between the differentiation circuit 30 and the input terminal 32 of the muting control circuit 34 is connected to the constant muting input terminal 38 through a resistor 37. Therefore, the input terminal 38 is supplied for a prescribed length of time with a muting signal whose voltage is lower than $V_1$ or higher than $V_2$, offering the advantage of enabling a constant muting operation to be reliably carried out. This constant muting operation can be controlled by conducting a muting control signal through the single input terminal 32 of the muting control circuit 34, preventing the circuit arrangement of the whole muting device from being complicated.

Figure 4:
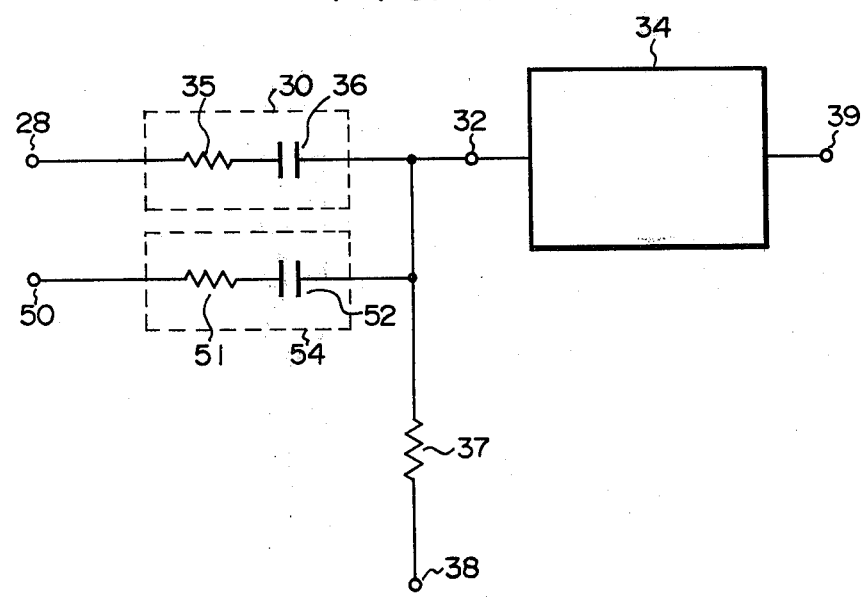
FIG. 4 schematically indicates the arrangement of a muting device according to another embodiment, wherein the input terminal of the muting control circuit is connected to a plurality of differentiation circuits.

With the muting device according to the second embodiment of FIG. 4, the input terminal 32 of the muting control circuit 34 is connected to not only the terminal 28 and differentiation circuit 30, but also another terminal 50 and a separate differentiation circuit 54 formed of a series circuit of a resistor 51 and capacitor 52. In other words, with the muting device according to the second embodiment of FIG. 4, a plurality of switching operation changeover signals are generated from the terminals 28, 50.

The muting device according to the second embodiment of this invention simultaneously carries out a transient muting function of conducting two switching operation changeover signals delivered from the two differentiation circuits 30, 54 through the single input terminal 32 of the muting control circuit 34 and also a constant muting function of letting a muting control signal pass through the input terminal 38 and further through the single input terminal 32. Therefore, with the muting device according to the second embodiment of FIG. 4, electronic parts or elements used with the muting control circuit 34 are reduced in number, offering an advantage particularly in the integration of a muting device. The muting device according to the second embodiment of FIG. 4 which requires only a small number of terminals and external parts can be expected to be not only reduced in cost but also prominently improved in reliability. With the second embodiment of FIG. 4, where an input signal whose waveform represents a voltage level lower than the predetermined lower voltage $V_1$ is supplied to the muting control circuit 34, then the output terminal 39 of the muting control circuit 34 always receives a muting-instructing signal. Where, therefore, an input voltage has its level transiently changed from zero volt to a regular voltage level by power supply to the amplifier, then the muting control circuit 34 never fails to be rendered conducting at least once. As a result, the muting control circuit 34 unfailingly issues a muting control signal at least once for the muting operation, thereby easily suppressing the occurrence of noises at power supply to the amplifier.

Although the present invention has been shown and described with respect to particular embodiments, nevertheless, various changes and modifications which are obvious to a person skilled in the art to which the invention pertains are deemed to lie within the spirit, scope and contemplation of the invention.

What we claim is:
1. A muting device comprising:
a signal-generating means for generating a switching operation changeover signal, said signal-generating means including DC power source means for having a predetermined DC voltage and for producing a DC current and switch means for receiving the DC current and for selectively generating the DC current at the output terminal thereof to produce said switching operation changeover signal;
changeover switching means connected to the output terminal of said switch means, for selectively transmitting one of a plurality of data signals in response to said switching operation changeover signal;
differentiation means connected to the output terminal of said switch means of said signal-generating means, for differentiating said switching operation changeover signal, said differentiation means including a single differentiation circuit for producing a differentiation signal having the positive and negative differentiated waveform components;
control circuit means having a single input terminal connected to the differentiation circuit of said differentiation means, for detecting whether a voltage level of said differentiation signal falls outside a predetermined voltage range and for generating a control signal when the voltage level at said negative differentiated waveform components is lower than a first voltage level which defines a minimum level of said voltage range or when the voltage level at said positive differentiated waveform components is higher than a second voltage level which defines a maximum level; and
muting switching means connected to said control circuit means, for attenuating said data signal selectively transmitted by said changeover switching means in response to said control signal from said control circuit means.

2. A muting device according to claim 1, which further comprises input means connected to the input terminal of said control circuit means, for receiving a constant muting signal having a voltage level outside said voltage range for a suitable length of time, said muting switching means also attenuating the data signal in response to the constant muting signal independently of the muting function of said control signal from said control circuit means.

3. A muting device according to claim 2, which further comprises second differentiation means connected to said single input terminal in parallel to said first differentiation means, for receiving and differentiating another switching operation changeover signal produced by another signal generator connected in series to said differentiation means so as to achieve a muting function independently of the muting function achieved in response to said switching operation changeover signal from said signal-generating means, said second differentiation means including a single differentiation circuit for differentiating said another switching operation changeover signal to produce and supply a differentiation signal having the positive and negative differentiated waveform components to the single input terminal of said control circuit means.

4. A muting device according to any one of claims 2 or 3, wherein the difference between the first and second voltage levels is set lower than DC voltage of said DC power source in said signal-generating means, said difference preferably ranging between 0.1 and 1 volt.

5. A muting device according to claim 3, wherein each of said differentiation circuits includes a series circuit of a resistor and a capacitor.

6. A muting device according to claim 2, wherein said control circuit means comprises:
 a first transistor having a collector, a base impressed with a bias voltage and an emitter impressed with an input voltage;
 a second transistor having a base impressed with said input voltage, an emitter impressed with said bias voltage, and a collector connected to said collector of said first transistor, and which is of the same type as said first transistor; and
 a third transistor for leading out output signals from said collectors of said first and second transistors.

7. A muting device comprising:
 signal-generating means for generating switching operation changeover signals;
 changeover switching means connected to said signal-generating means, for selectively transmitting one of a plurality of data signals in response to said switching operation changeover signal;
 at least one differentiation circuit means connected to said signal-generating means, for differentiating said switching operation changeover signal;
 control circuit means connected to said differentiation circuit means for generating a control signal when a signal generated from said differentiation circuit means has a voltage level lower than a first predetermined voltage level or higher than a second predetermined voltage level which is arranged to be higher than said first predetermined voltage level, said control circuit means comprising:
 a first transistor having a collector, a base impressed with a bias voltage and an emitter impressed with an input voltage;
 a second transistor having a base impressed with said input voltage, an emitter impressed with said bias voltage, and a collector connected to said collector of said first transistor, and which is of the same type as said first transistor; and
 a third transistor for providing output signals from said collectors of said first and second transistors; and
 muting switching means which is connected to said control circuit means, and is actuated in response to said control signal output by said control circuit means, for attenuating said data signal selectively transmitted by said changeover switching means.

8. A muting device according to claim 7, wherein said differentiation circuit means comprises a plurality of series circuits wich are respectively formed of a resistor and a capacitor and connected in parallel with said control circuit means.

9. A muting device according to claim 7, wherein said control circuit means is provided with a single input terminal.

10. A muting device according to claim 4, wherein said differentiation circuit means comprises two series circuits each formed of a resistor and a capacitor.

11. A muting device according to claim 7, wherein a difference between said first predetermined voltage level and said second predetermined voltage level ranges between 0.1 and 1 volt.

12. A muting device according to claim 9, wherein said input terminal of said control circuit means is connected through at least a resistor to a constant muting input terminal to which a constant muting signal is supplied for performing a constant muting operation.

* * * * *